United States Patent
Freitag et al.

(10) Patent No.: US 9,831,419 B2
(45) Date of Patent: Nov. 28, 2017

(54) MAGNETORESISTIVE DEVICE WITH LAMINATE INSERTION LAYER IN THE FREE LAYER

(71) Applicant: HGST Netherlands B.V., Amsterdam (NL)

(72) Inventors: James Freitag, Sunnyvale, CA (US); Zheng Gao, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 14/797,759

(22) Filed: Jul. 13, 2015

(65) Prior Publication Data
US 2017/0018703 A1    Jan. 19, 2017

(51) Int. Cl.
| | | |
|---|---|---|
| *H01L 43/08* | (2006.01) | |
| *H01L 27/22* | (2006.01) | |
| *H01L 43/02* | (2006.01) | |
| *H01L 43/10* | (2006.01) | |
| *H01L 43/12* | (2006.01) | |

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01L 43/00; H01L 27/222; H01L 27/224; H01L 27/11502; H01L 21/28291; H01L 37/04; H01L 2924/1441; H01L 2924/14412

See application file for complete search history.

(56) References Cited

U.S. PATENT DOCUMENTS

| | | |
|---|---|---|
| 5,650,958 A | 7/1997 | Gallagher et al. |
| 6,219,212 B1 | 4/2001 | Gill et al. |
| 6,674,617 B2 | 1/2004 | Gill |
| 7,502,211 B2 | 3/2009 | Gill |
| 7,505,235 B2 | 3/2009 | Freitag et al. |
| 8,194,365 B1 | 6/2012 | Leng et al. |
| 8,216,703 B2 | 7/2012 | Sun et al. |
| 8,270,125 B2 | 9/2012 | Gill |
| 8,421,171 B2 | 4/2013 | Yen et al. |
| 8,427,791 B2 | 4/2013 | Gao et al. |
| 8,492,859 B2 | 7/2013 | Hu |

(Continued)

*Primary Examiner* — Galina Yushina
(74) *Attorney, Agent, or Firm* — Jacobsen IP Law; Krista S. Jacobsen

(57) ABSTRACT

A magneto-resistive (MR) device and process for making the MR device are disclosed. The MR device has a pinned layer, a spacer layer proximate to the pinned layer, and a free layer proximate to the spacer layer. The free layer comprises a first magnetic layer proximate to the spacer layer, the first magnetic layer having a positive magnetostriction, a laminate magnetic insertion layer proximate to the first magnetic layer, and a second magnetic layer proximate to the magnetic insertion layer, the second magnetic layer having a negative magnetostriction. The laminate magnetic insertion layer has a first magnetic sublayer and a first non-magnetic sublayer proximate to the first magnetic sublayer. With the disclosed laminate magnetic insertion layer, the free layer has a low overall magnetostriction and results in a MR device with a high MR ratio.

22 Claims, 13 Drawing Sheets

(56) References Cited

U.S. PATENT DOCUMENTS

| | | | | |
|---|---|---|---|---|
| 8,514,616 | B2* | 8/2013 | Ishiwata | G11C 11/16 |
| | | | | 257/E29.323 |
| 8,609,262 | B2 | 12/2013 | Horng et al. | |
| 9,040,178 | B2* | 5/2015 | Zhao | B82Y 10/00 |
| | | | | 257/421 |
| 9,293,159 | B2 | 3/2016 | Jung et al. | |
| 2009/0213503 | A1* | 8/2009 | Sun | B82Y 10/00 |
| | | | | 360/324.2 |
| 2010/0073828 | A1* | 3/2010 | Wang | B82Y 10/00 |
| | | | | 360/324.12 |
| 2011/0188157 | A1* | 8/2011 | Zhao | G11B 5/3906 |
| | | | | 360/313 |
| 2012/0068284 | A1* | 3/2012 | Kitagawa | H01L 43/08 |
| | | | | 257/421 |
| 2012/0127603 | A1* | 5/2012 | Gao | B82Y 10/00 |
| | | | | 360/75 |
| 2012/0280336 | A1* | 11/2012 | Jan | H01L 43/08 |
| | | | | 257/421 |
| 2014/0027869 | A1 | 1/2014 | Lee et al. | |
| 2014/0111195 | A1* | 4/2014 | Kuo | G01R 33/098 |
| | | | | 324/252 |
| 2014/0183673 | A1 | 7/2014 | Zhang et al. | |
| 2015/0008550 | A1 | 1/2015 | Min et al. | |
| 2015/0129946 | A1* | 5/2015 | Annunziata | H01L 43/08 |
| | | | | 257/295 |

* cited by examiner

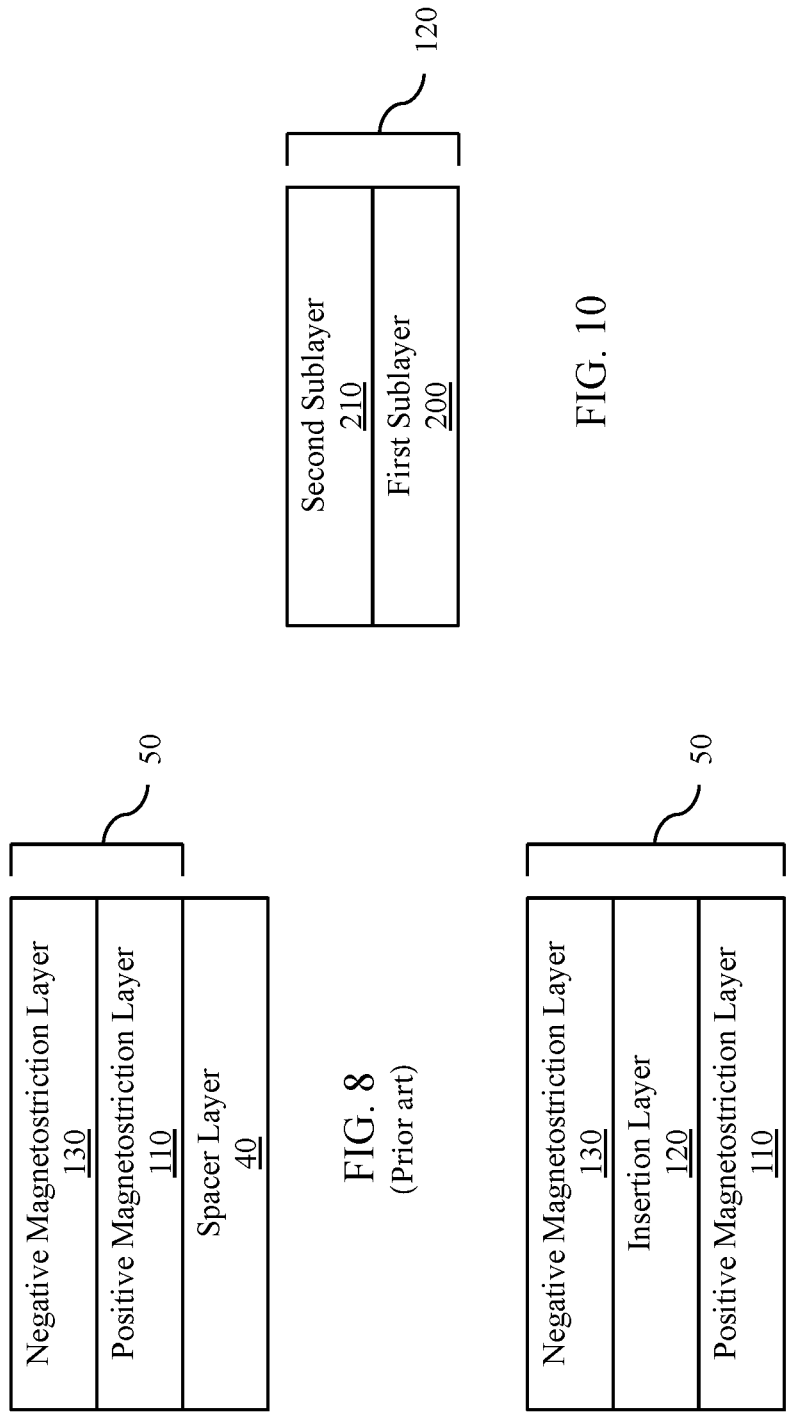

MAGNETORESISTIVE DEVICE WITH LAMINATE INSERTION LAYER IN THE FREE LAYER

BACKGROUND

Magnetoresistive (MR) devices can be used in many applications, including, for example, hard disk drive read sensors and magnetic random access memory (MRAM) devices. The electrical resistivity of a MR device changes when that device is subjected to an external magnetic field. When the MR device is subjected to an external magnetic field of a first polarity, the resistance is a higher value, and when the device is subjected to an external magnetic field of a substantially opposite polarity, the resistance is a lower value. If the high-resistance state represents a 0, and the low-resistance state represents a 1, or vice versa, MR devices can be used to store information, for example, on a MRAM device. Similarly, MR devices can be used in read sensors to retrieve information from magnetic media, such as, for example, from a magnetic hard disk drive storing bits.

The magnetoresistance (MR) ratio of a MR device is the ratio of the difference in resistance between the high- and low-resistance states to the resistance of the low-resistance state. In both MRAM and hard disk drive applications, it is desirable for MR devices to exhibit a high MR ratio to reduce the likelihood that a 0 is stored as or mistaken for a 1 and vice versa.

Thus, there is an ongoing need to improve the MR ratio of MR devices.

SUMMARY

Disclosed herein are novel MR devices and processes for fabricating such MR devices. Also disclosed are read sensors, hard disk drives, and memory devices that include the novel MR devices.

The MR devices comprise a pinned layer, a spacer layer proximate to the pinned layer, and a free layer proximate to the spacer layer. The spacer layer may include magnesium oxide (MgO), copper (Cu), silver (Ag), Ag—Sn alloys, aluminum oxide, or titanium dioxide. The free layer comprises (a) a first magnetic layer proximate to the spacer layer, the first magnetic layer having a positive magnetostriction, (b) a magnetic insertion layer proximate to the first magnetic layer, and (c) a second magnetic layer proximate to the magnetic insertion layer. In some embodiments, the second magnetic layer has a negative magnetostriction that approximately cancels the positive magnetostriction of the first magnetic layer. In some embodiments, the first magnetic layer comprises cobalt (Co), iron (Fe), boron (B), or a combination of these elements. In some embodiments, the second magnetic layer comprises nickel (Ni), iron (Fe), or a combination of these elements.

The magnetic insertion layer has at least a first insertion layer unit, the first insertion layer unit comprising a first magnetic sublayer and a first non-magnetic sublayer proximate to the first magnetic sublayer. In some embodiments, the thickness of the magnetic insertion layer is less than 12 Angstroms. In some embodiments, the thickness of the first magnetic sublayer is less than three times the thickness of the first non-magnetic sublayer. In some embodiments, the first magnetic sublayer comprises iron (Fe), cobalt (Co), or alloys thereof. In other embodiments, the first non-magnetic sublayer comprises tantalum (Ta), hafnium (Hf), tungsten (W), vanadium (V), niobium (Nb), zirconium (Zr), titanium (Ti), molybdenum (Mo), or chromium (Cr).

In some embodiments, the first magnetic sublayer is proximate to the first magnetic layer. In some embodiments, the magnetic insertion layer further comprises a second magnetic sublayer proximate to the first non-magnetic sublayer.

In some embodiments, the magnetic insertion layer comprises multiple insertion layer units, each having a magnetic sublayer and a non-magnetic sublayer, wherein all of the multiple insertion layer units are oriented identically so that the magnetic insertion layer has a laminated structure. The materials used in the multiple insertion layer units may be the same, or they may be different. Likewise, the thicknesses of the multiple insertion layer units can be the same, or different insertion layer units can have different thicknesses.

In some embodiments having multiple insertion layer units, the MR device further comprises a second magnetic sublayer proximate to a last insertion layer unit, the last insertion layer unit being one of the one or more additional insertion layer units that is furthest away from the first insertion layer unit. In some such embodiments, the first magnetic sublayer is proximate to the first magnetic layer, and the second magnetic sublayer is proximate to the second magnetic layer.

A process for fabricating the MR devices comprises forming a pinned layer, forming a spacer layer proximate to the pinned layer, and forming a free layer proximate to the spacer layer. Forming the free layer comprises forming a first magnetic layer proximate to the spacer layer, the first magnetic layer having a positive magnetostriction, forming a magnetic insertion layer proximate to the first magnetic layer, and forming a second magnetic layer proximate to the magnetic insertion layer. The second magnetic layer may have a negative magnetostriction that approximately cancels the positive magnetostriction of the first magnetic layer. The magnetic insertion layer comprises a first insertion layer unit that includes a first magnetic sublayer and a first non-magnetic sublayer proximate to the first magnetic sublayer. In some embodiments, sputtering is used to form one or more layers of the MR devices.

BRIEF DESCRIPTION OF THE DRAWINGS

The disclosure herein is illustrated by way of example, and not by way of limitation, in the figures of the accompanying drawings, in which like reference numerals refer to similar elements and in which:

FIG. 3 illustrates six layers of a magnetic tunnel junction (MTJ) device that may incorporate some embodiments.

FIG. 6 illustrates an exemplary pinned layer that may be used with some embodiments.

FIG. 8 illustrates a spacer layer and a free layer having a positive magnetostriction layer and a negative magnetostriction layer.

FIG. 9 illustrates an improved free layer in accordance with some embodiments.

FIG. 10 illustrates a free layer insertion layer with two sublayers in accordance with some embodiments.

DETAILED DESCRIPTION

The following description is made for the purpose of illustrating the general principles of the present disclosure and is not meant to limit the inventive concepts claimed herein. Furthermore, particular features described herein can be used in combination with other described features in various possible combinations and permutations. Specifically, although it will be appreciated that much of the disclosure below refers primarily to magnetic tunnel junction (MTJ) devices, which are tunneling magnetoresistance (TMR) devices, it is to be understood that the disclosed principles also apply to giant magnetoresistance (GMR) devices and even to anisotropic magnetoresistance (AMR) devices. Similarly, although this disclosure focuses primarily on MRAM and read sensor applications using MR devices, the benefits of the disclosed embodiments inure generally to MR devices.

Figure 1:
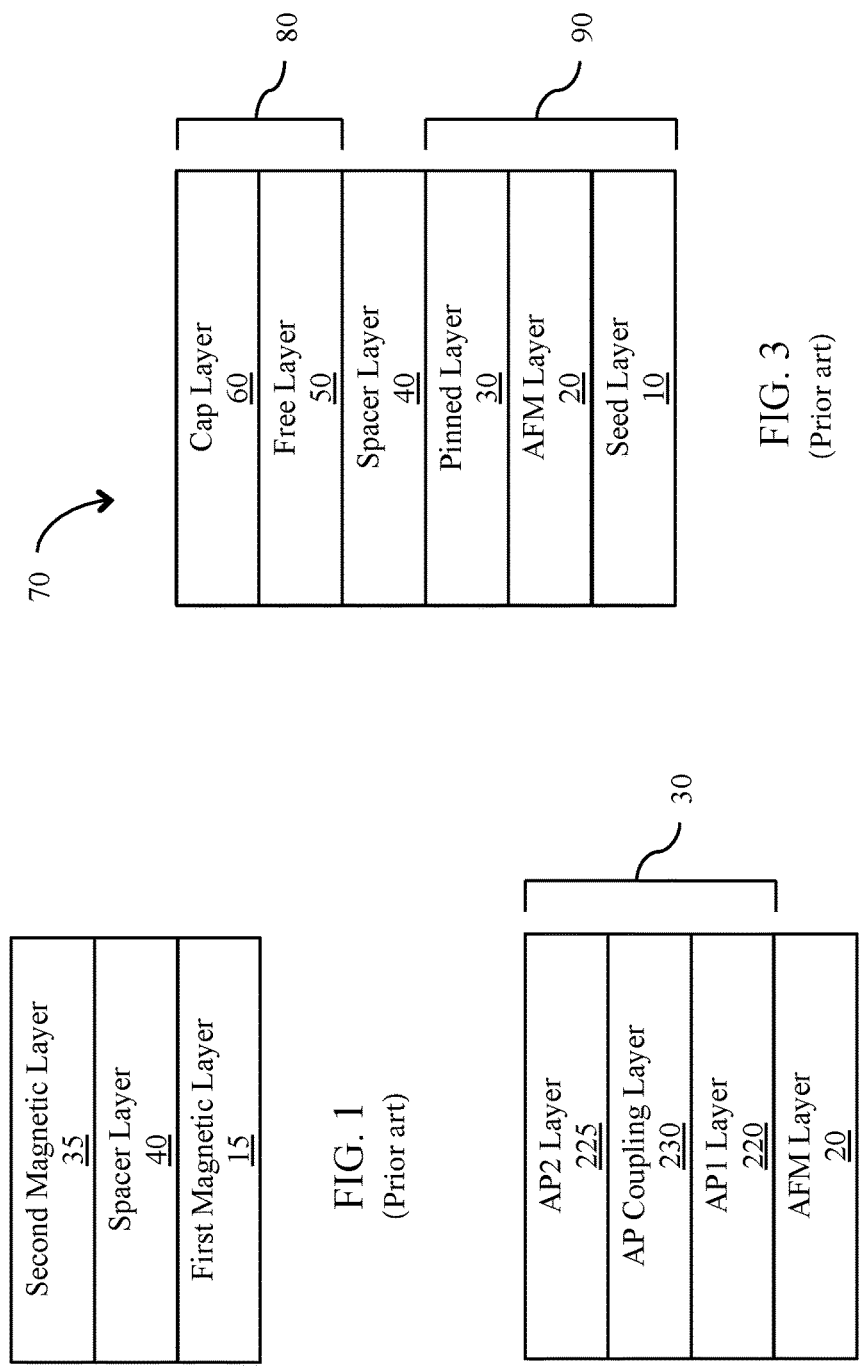
FIG. 1 illustrates three layers of a giant magnetoresistance (GMR) or tunneling magnetoresistance (TMR) device that may incorporate some embodiments.

Two types of MR devices are GMR devices and TMR devices. Generally, and as illustrated in FIG. 1, a GMR device includes two magnetic layers, a first magnetic layer 15 and a second magnetic layer 35, separated by a spacer layer 40. The spacer layer 40 is conducting and non-magnetic in a GMR device. Each of magnetic layers 15 and 35 has a unidirectional magnetic moment within its plane. The orientation of the magnetic moment of the second magnetic layer 35 relative to the first magnetic layer 15 (or vice versa) determines the electrical resistance experienced by a current that passes from one magnetic layer to the other through the spacer layer 40. The conduction electrons are spin polarized by interaction with the magnetic moments of the magnetic layers 15 and 35, and this polarization affects the electrons' scattering properties within the layers 15 and 35, thus changing the resistance of the device. Consequently, a GMR device is effectively a variable resistor, the resistance of which is dependent on and controlled by the angle between the magnetic moments of the two magnetic layers 15 and 35. By measuring the voltage across the GMR device while a known current flows through the device, it is possible to determine the resistance of the GMR device.

Still referring to FIG. 1, a tunneling magnetoresistive (TMR) device has a similar structure to that used in a GMR device, but the spacer layer 40 is a thin dielectric layer, sometimes referred to as the tunnel barrier layer, instead of a conductor. The relative orientations of the magnetic moments in the first and second magnetic layers 15 and 35 control the flow of spin-polarized electrons tunneling through the spacer layer. As in a GMR device, when an injected electron passes through one of the magnetic layers 15, 35 of a TMR device, it is spin polarized by interaction with the direction of the magnetic moment of that layer. The probability of such an electron then tunneling through the spacer layer 40 into the other magnetic layer depends on the availability of states within the other magnetic layer that the tunneling electron can occupy. This number, in turn, depends on the magnetization direction (the direction of the magnetic moment) of the other magnetic layer. The tunneling probability is thus spin-dependent, and the magnitude of the current (i.e., the tunneling probability multiplied by the number of electrons impinging on the spacer layer 40) depends upon the relative orientations of the magnetizations of magnetic layers 15, 35 on either side of the spacer layer 40.

MR devices such as the GMR or TMR devices described above may be used as read sensors in hard disk drives. Direct-access storage devices, such as disk drives, typically include rotating magnetic disks that store data in magnetic form on the surface of a disk. Data is recorded on and read from concentric, radially-spaced tracks on the disk surface by magnetic transducers called "heads." The magnetic disks are rotated at high speeds, producing a thin layer of air over the disks. The read and write heads are supported over the rotating disk by this thin layer of air, where they either induce or detect a magnetic field on the magnetic disk, thereby either writing or reading data, respectively.

Figure 2:
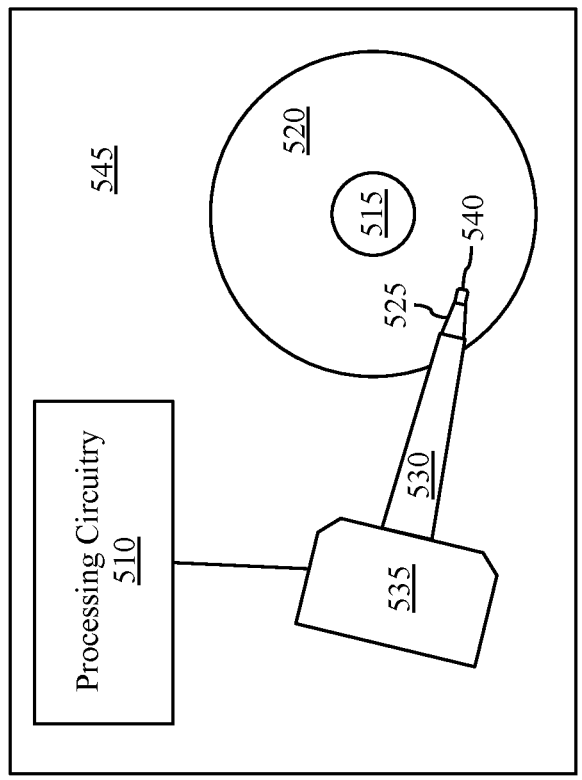
FIG. 2 illustrates several components of an exemplary hard disk drive that may incorporate some embodiments.

FIG. 2 illustrates several components of an exemplary hard disk drive that may incorporate some of the embodiments disclosed herein. A magnetic hard disk drive 500 includes a spindle 515 that supports and rotates a magnetic disk 520. The spindle 515 is rotated by a spindle motor (not shown) that is controlled by a motor controller (not shown) that may be implemented in electronics of the hard disk drive 500. A slider 525, which is supported by a suspension and actuator arm 530, has a combined read and write magnetic head 540. The suspension and actuator arm 530 is rotatably positioned by an actuator 535. The head 540 may include a GMR sensor, a TMR sensor, or another type of MR sensor. The components of the hard disk drive 500 may be mounted on a housing 545. It is to be understood that although FIG. 2 illustrates a single disk 520, a single slider 525, and a single suspension and actuator arm 530, hard disk drive 500 may include a plurality (i.e., more than one) of disks 520, sliders 525, and suspension and actuator arms 530.

In operation, the actuator 535 moves the suspension and actuator arm 530 to position the slider 525 so that the magnetic head 540 is in a transducing relationship with the surface of the magnetic disk 520. When the spindle motor rotates the disk 520, the slider 525 is supported on a thin cushion of air known as the air bearing that exists between the surface of the disk 520 and an air-bearing surface (ABS) of the head 540. The head 540 may be used to write information to multiple tracks on the surface of the disk 520 and to read previously-recorded information from the tracks on the surface of the disk 520. Processing circuitry 510 provides signals representing information to be written to the disk 520 to the head 540 and receives signals representing information read from the disk 520 from the head 540. Processing circuitry 510 also provides signals to the spindle motor to rotate the magnetic disk 520, and to the actuator 535 to move the slider 525 to various tracks.

To read information from the magnetic disk 520, the magnetic head 540 passes over a region of the disk 520 and detects changes in resistance due to magnetic field variations recorded on the disk 520, which represent the recorded bits.

Magnetic random access memory (MRAM) devices may also include MR devices. In MRAM, data is stored by the magnetization of storage elements (e.g., cells). A single MRAM device may comprise an array of cells, where each cell comprises a MR device and two crossing conductive lines either above or below the cell. Each cell stores one bit of information, i.e., either a 0 or a 1. To write to a cell, appropriate currents are applied to the two crossing conductive lines to generate an external magnetic field of the appropriate polarity. The intersection of the two crossing conductive lines generates a peak magnetic field that is greater than the switching threshold of the MR device, thus causing the magnetic moment of one of the magnetic layers to rotate relative to the magnetic moment of the other layer, depending on whether a 0 or 1 is being written. The lower-resistance state can be used to store a 0, and the higher-resistance state can be used to store a 1, or vice versa. To read an MRAM cell, a sensing current is applied through the cell to detect the resistance of the MR device and, based on that resistance, to determine whether the MR device is in the lower-resistance or higher-resistance state.

One specific type of TMR device is a magnetic tunnel junction (MTJ) device. FIG. 3 illustrates several layers of materials that may be included in a conventional MTJ 70. The MTJ 70 of FIG. 3 includes two ferromagnetic electrodes 80 and 90 separated by a thin, insulating spacer layer 40, which is sometimes referred to as a tunnel barrier layer. As explained above in conjunction with FIG. 1, the spacer layer 40 is thin enough that electrons are able to tunnel between the ferromagnetic electrodes 80 and 90 when a bias current is applied across the device. One electrode 90 of the MTJ 70 includes a pinned ferromagnetic layer 30, an antiferromagnetic (AFM) layer 20, and a seed layer 10. The other electrode 80 of the MTJ 70 includes a free layer 50 and, optionally, a cap layer 60. It is to be understood that FIG. 3 is a simplified illustration of a MTJ device and does not necessarily illustrate all of the layers and components that may be included in a MTJ device. Moreover, a MTJ device might not include all of the layers shown in FIG. 3. For example, a MTJ device may include additional layers to those shown in FIG. 3, or it may omit or change one or more of the layers shown in FIG. 3.

The magnetic moment of the pinned layer 30 is fixed through exchange coupling with the AFM layer 20. The magnetic moment of the free layer 50 is free to rotate in the presence of an applied magnetic field.

In a hard disk drive using a read sensor that includes a MTJ device, to read the data on a disk, a sensing current flows from one electrode (e.g., electrode 80 or 90) of the MTJ 70, through the spacer layer 40, to the other electrode of the MTJ 70 (e.g., electrode 90 or 80). The probability of an electron tunneling across the spacer layer 40 depends on the relative alignment of the magnetic moments of the free layer 50 and the pinned ferromagnetic layer 30. Typically, the tunneling probability is highest when the angle between the magnetic moments of the pinned layer 30 and the free layer 50 is at its smallest (e.g., zero or a small number), and, conversely, the tunneling probability is lowest when the angle between the magnetic moments of the pinned layer 30 and free layer 50 is largest (e.g., a larger number up to 180 degrees when the magnetic moments are pointing in opposite directions). The resistance of the MTJ 70 is a function of the tunneling current across the spacer layer 40. Thus, when the magnetic moments of the pinned layer 30 and the free layer 50 are closer to parallel, the electrical resistance of the spacer layer 40 is lower, and the voltage across the electrodes 80 and 90 is higher. Conversely, when the magnetic moments of the pinned layer 30 and the free layer 50 are closer to antiparallel, the electrical resistance of the spacer layer 40 is higher, and the voltage across the electrodes 80 and 90 is lower.

Figure 4:
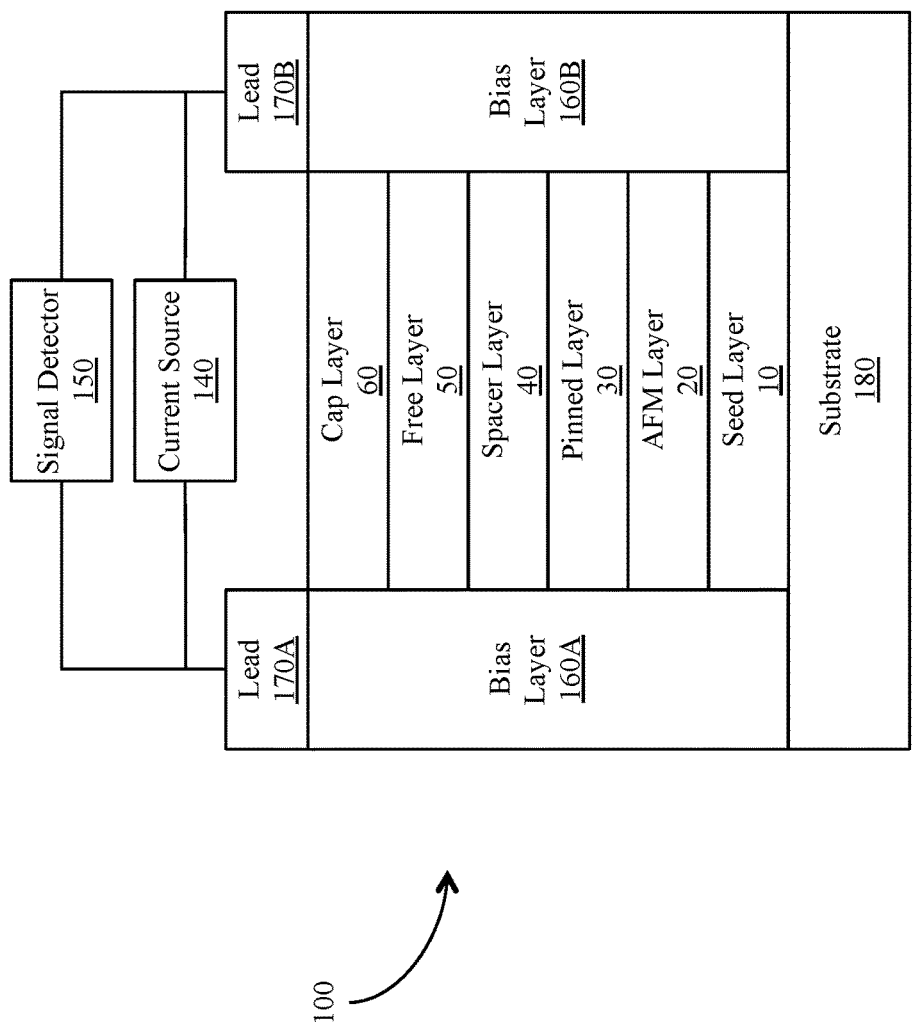
FIG. 4 illustrates an air-bearing surface (ABS) view of a current-in-plane (CIP) MR sensor that may incorporate some embodiments and may be used in a hard disk drive head.

FIG. 4 illustrates an ABS view of a current-in-plane (CIP) MR sensor 100 that may incorporate some embodiments and may be used in a hard disk drive head. A free layer (free ferromagnetic layer) 50 is separated from a pinned layer (antiparallel-pinned ferromagnetic layer) 30 by a spacer layer 40. As explained above, the spacer layer 40 may be conducting if the MR sensor is a GMR device, and it may be a dielectric if the MR sensor is a TMR device, such as a MTJ. The magnetization (i.e., the magnetic moment) of the pinned layer 30 may be fixed through exchange coupling with an antiferromagnetic (AFM) layer 20. The magnetization of the pinned layer is pinned at about ninety degrees to the air bearing surface. The magnetization of the free layer 50, however, is free to rotate in the presence of an external magnetic field. Several embodiments of the free layer 50 are discussed in detail below.

Cap layer 60, free layer 50, spacer layer 40, pinned layer 30, AFM layer 20, and seed layer 10 form a stack. The seed layer 10 is formed on a substrate 180 to promote the texture and enhance the grain growth of each of the layers subsequently grown in or adjacent to the stack (e.g., the AFM layer 20 and the bias layers 160A and 160B). Cap layer 60 is optionally formed on the free layer 50. The cap layer 60 protects the other layers of the stack from damage during subsequent manufacturing processes such as annealing. Bias layers 160A and 160B formed on either side of the stack provide longitudinal bias for the free layer 50. Leads 170A and 170B, formed over bias layers 160A and 160B, respectively, provide electrical connections for the flow of a sensing current from a current source 140 to the MR sensor 100.

The sensor current produced by the current source 140 flows from one end of the free layer 50 to the other end of the free layer 50 in the plane of the free layer 50. A signal detector 150, which is electrically connected to the leads 170A and 170B, senses the change in resistance of the MR sensor 100 caused by changes induced by the external magnetic field (e.g., the field generated when a field transition on a disk is moved past the MR sensor 100). For example, the signal detector 150 may detect the voltage across leads 170A and 170B and, based on that voltage, determine whether the MR sensor 100 is in a low-resistance or high-resistance state. The CIP MR sensor 100 shown in FIG. 4 is merely exemplary, and other constructions of the CIP MR sensor 100 are possible.

Figure 5:
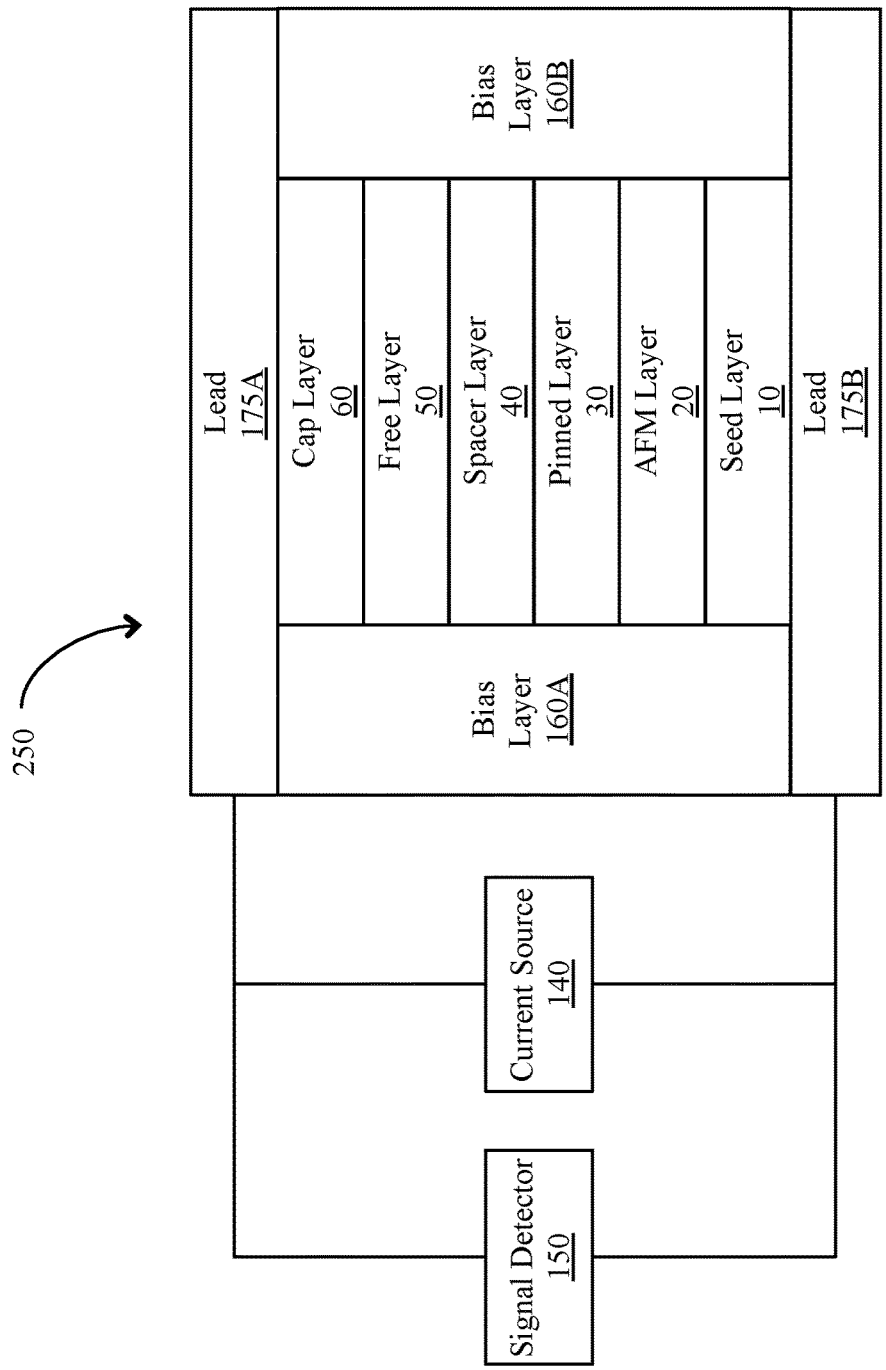
FIG. 5 illustrates an ABS view of a current-perpendicular-to-the-plane (CPP) MR sensor that may incorporate some embodiments and may be used in a hard disk drive head.

FIG. 5 illustrates an ABS view of a current-perpendicular-to-the-plane (CPP) MR sensor 250 that may incorporate some embodiments and may be used in a hard disk drive head. In FIG. 5, the MR sensor 250 includes a stack like that shown in FIG. 4 (i.e., including seed layer 10, AFM layer 20, pinned layer 30, spacer layer 40, free layer 50, and cap layer 60) sandwiched between leads 175A and 175B. The leads 175A and 175B can be constructed of an electrically conductive, magnetic material such as NiFe and can thereby serve as magnetic shields as well as leads. The magnetic bias layers 160A and 160B may be provided at either side of the stack to provide magnetic biasing for the free layer 50.

The pinned layer structure may be one of many types of pinned layers, such as, for example, a self-pinned, antiparallel (AP)-coupled pinned layer, an AFM-pinned structure, or a simple pinned structure having a single magnetic layer exchange coupled with a layer of antiferromagnetic material (AFM). FIG. 6 illustrates an exemplary configuration for pinned layer 30. As illustrated in FIG. 6, the pinned layer structure may include a first magnetic layer, AP1 layer 220, and a second magnetic layer, AP2 layer 225, separated by and exchange coupled with a non-magnetic, electrically conductive antiparallel coupling layer, AP coupling layer 230. The AP coupling layer 230 may be constructed of many materials, such as ruthenium (Ru), chromium (Cr), etc. The AP coupling layer 230 is configured to provide anti-parallel coupling of AP1 layer 220 and AP2 layer 225. The AP1 layer 220 is preferably exchange coupled with AFM layer 20. This exchange coupling with the AFM layer 20 strongly pins the magnetic moment of the AP1 layer 220 in a first direction perpendicular to the ABS. The strong antiparallel coupling of the AP1 layer 220 and the AP2 layer 225 strongly sets the magnetic moment of the AP2 layer 225 in a direction opposite that of the magnetic moment of the AP1 layer 220.

Referring back to FIG. 5, the free layer 50 has a magnetic moment that is biased in a direction parallel to the ABS and perpendicular to the moments of the pinned layer 30 (i.e., the moments of the AP1 layer 220 and the AP2 layer 225). The biasing for the moment of the free layer 50 is from magnetostatic coupling with the bias layers 160A and 160B, which may include insulating isolation layers to prevent electrical shunting around the device.

The stack of the MR sensor 250 may also include a seed layer 10 disposed at the bottom of the stack. The seed layer 10 promotes a desired crystalline growth in the subsequently deposited layers, thereby providing improved sensor performance. The stack may also include a cap layer 60 formed at the top of the stack. Other constructions of the CPP MR sensor 250 are possible.

The sensor current in the MR sensor 250 flows from one lead 175A or 175B to the other lead 175B or 175A perpendicular to the plane of the free layer 50. A signal detector 150, which is electrically connected to the leads 175A and 175B, senses the change in resistance of the MR sensor 250 caused by changes induced by the external magnetic field (e.g., the field generated when a field transition on a disk is moved past the MR sensor 250). For example, the signal detector 150 may detect the voltage across leads 175A and 175B and, based on that voltage, determine whether the MR sensor 250 is in a low-resistance or high-resistance state.

Figure 7:
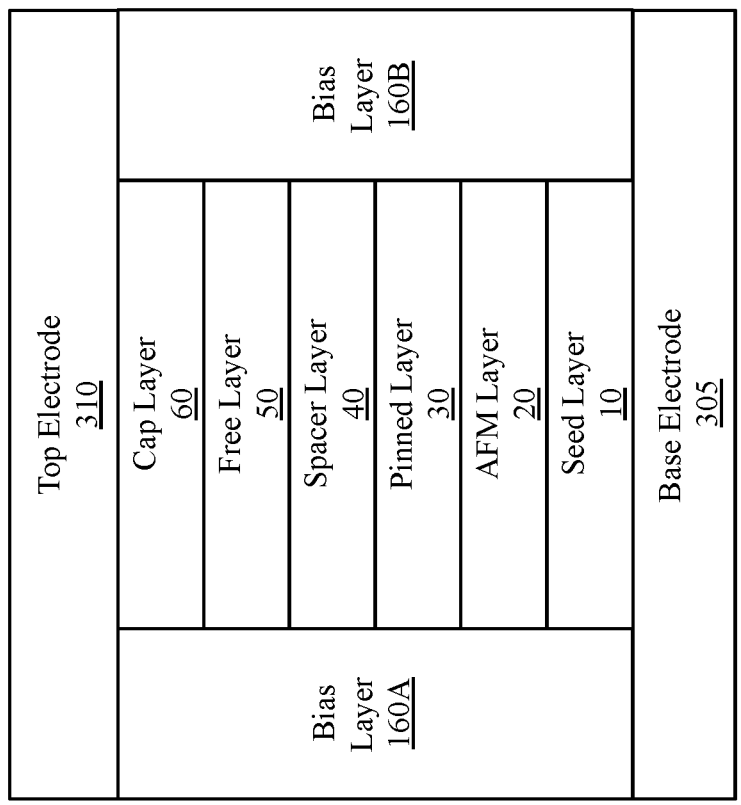
FIG. 7 illustrates a cross-section of a MR device that may incorporate some embodiments and may be used as a memory cell, such as in MRAM.

FIG. 7 illustrates a cross-section of a MR device 300 that may incorporate some embodiments and may be used as a memory cell, such as in MRAM. MR device 300 includes a stack like that shown in FIG. 4 and FIG. 5 (i.e., including seed layer 10, AFM layer 20, pinned layer 30, spacer layer 40, free layer 50, and cap layer 60) and bias layers 160A and 160B, as in FIG. 4 and FIG. 5. MR device 300 also includes base electrode 305 and top electrode 310.

For magnetic fields of magnitude comparable to those applied to the memory cell during read and write operations of the cell, there is only one possible orientation for the magnetization of the pinned layer 30. The free layer 50 is anisotropic in its magnetization properties, but its magnetization direction is not pinned. Instead, the magnetic moment of the free layer 50 can be stably oriented along either direction of the easy axis by the application of a magnetic field in the desired range. FIG. 7 illustrates only one exemplary configuration of the MR device 300 for use in memory cell applications. It is to be appreciated that other constructions are possible.

When a MR device is used in a hard disk drive read sensor, the sensitivity of the read sensor is directly proportional to the difference in the electrical resistivity of the spacer layer 40 when it is subjected to an external magnetic field of a first polarity and when it is subjected to an external magnetic field of the opposite polarity. When the MR device is a MTJ, this difference is called the tunnel magnetoresistance (TMR). To maximize the probability of correctly reading data on the disk, it is desirable for a read sensor to have a high MR ratio dR/R, where R is the minimum resistance of the MR device, and dR is the magnitude of the change in resistance observed by changing the magnetic moment of the free layer 50 from the minimum resistance (when the angle between the magnetic moments of the free layer 50 and the pinned layer 30 is minimized) to the maximum resistance (when the angle between the magnetic moments of the free layer 50 and the pinned layer 30 is maximized).

When a MR device is used in a MRAM cell, it is likewise desirable for the MR device to have a high MR ratio to enable the determination of whether a cell of an MRAM cell has stored a 0 or a 1, which is based on the detected resistance of the MR device. A high MR ratio reduces the likelihood of a 0 being misread as a 1 and vice versa. Thus, it is desirable in both read sensor and MRAM applications to have a high MR ratio, regardless of whether the MR device is a GMR or TMR device.

When the MR device is a MTJ device, the spacer layer 40 may be made of magnesium oxide (MgO), and the pinned layer 30 and the free layer 50 may be made of CoFe or CoFeB. Both CoFe and CoFeB have positive magnetostriction, which, as would be understood by a person having ordinary skill in the art, is an elastic deformation of a material that occurs with a change in its magnetization. To improve the stability of such a MTJ device, it is desirable to compensate for this positive magnetostriction in the free layer 50.

To compensate for the positive magnetostriction of CoFe or CoFeB in the free layer 50, the free layer 50 may itself include multiple layers. For example, as illustrated in FIG. 8, the free layer 50 may include a negative magnetostriction layer 130 in addition to the positive magnetostriction layer 110. If the positive magnetostriction layer 110 includes CoFe, CoFeB, or both CoFe and CoFeB, the negative magnetostriction layer 130 may be made of a material that has a negative magnetostriction to balance or substantially cancel the positive magnetostriction of the positive magnetostriction layer 110. For example, the negative magnetostriction layer 130 may be a layer of Ni or a Ni-rich NiFe alloy that has a negative magnetostriction to substantially cancel the positive magnetostriction of the CoFe or CoFeB in the positive magnetostriction layer 110.

When the free layer 50 includes the negative magnetostriction layer 130 as shown in FIG. 8, however, the MR ratio can degrade because of diffusion of atoms or molecules of the material used in the negative magnetostriction layer 130 through the positive magnetostriction layer 110 and into the spacer layer 40. As an example, if the spacer layer 40 is made of MgO, and the negative magnetostriction layer 130 is made of Ni or a Ni-rich NiFe alloy, Ni atoms can diffuse into the spacer layer 40. In hard disk drive applications, diffusion of Ni (or any other material) from the negative magnetostriction layer 130 into the spacer layer 40 can result in lower sensor performance by reducing the amount by which the electrical resistivity of the read sensor differs when the magnetic field recorded on the disk changes direction. Likewise, in MRAM applications, diffusion of atoms or molecules from the negative magnetostriction layer 130 into the spacer layer 40 can result in a smaller difference in resistivity of a memory cell when it stores a 0 versus when it stores a 1, thus increasing the likelihood of a 0 being mistaken for a 1 and vice versa.

Another drawback of including a negative magnetostriction layer 130 in the free layer 50 is that the materials having negative magnetostriction can cause lattice mismatching between the positive magnetostriction layer 110 and the spacer layer 40, particularly if the spacer layer includes MgO. For example, including Ni or NiFe in the negative magnetostriction layer 130 to counteract the positive magnetostriction of CoFe or CoFeB in the positive magnetostriction layer 110 can cause lattice mismatching between the CoFe or CoFeB and the MgO spacer layer 40, thus adversely affecting the textures of both the free layer 50 and the spacer layer 40, which also reduces the MR ratio. Thus, there is a need to develop a free layer 50 that has a low overall magnetostriction and yet still results in a MR device with a high MR ratio.

Several approaches to improve the MR ratios of MR devices have been proposed in the prior art. U.S. patent publication US 2014/0183673 by Zhang et al. ("Zhang") proposes a free layer that includes layers of CoFeB and NiFe and multiple insertion layers. Each insertion layer is preferably between 2 and 5 Angstroms thick and is made entirely of iron or an iron-rich alloy. Thus, Zhang proposes to include multiple insertion layers in the free layer, each of which contains iron.

U.S. Pat. No. 8,216,703 to Sun et al. ("Sun") proposes a free synthetic antiferromagnetic (SAF) layer that includes a stack of sequentially formed ferromagnetic and non-ferromagnetic double layers, where each double layer is comprised of a thin non-ferromagnetic layer of Ta, Zr, Hf, Ti, V, Mg, Nb, Zn, or Cr, and a thicker ferromagnetic layer of NiFe or CoFe. Each non-ferromagnetic layer is preferably 0.3 to 1 Angstrom thick, and each ferromagnetic layer is preferably 5 to 10 Angstroms thick. Thus, the average thickness of individual ferromagnetic layers is preferably about 15-25 times the average thickness of non-ferromagnetic layers.

Although these approaches may improve the MR ratio, they can also introduce problems. For example, magnetic amorphous insertion layers, such as those disclosed by Zhang and Sun, may need to be thick (e.g., thicker than 20 Angstroms) to achieve a high MR ratio. When the free layer includes a negative magnetostriction layer 130 (e.g., NiFe or another Ni-rich alloy) to counteract the effects of the positive magnetostriction layer 110 (e.g., CoFe, CoFeB, or a combination of the two), such thick layers can decouple the positive magnetostriction layer 110 from the negative magnetostriction layer 130, thereby causing noise in the MR device. In addition, for read sensor applications, MR devices may be patterned using, e.g., ion milling, and thicker insertion layers can increase the difficulty of being able to define a clean junction. Moreover, thick insertion layers increase the read gap of the sensor, where the read gap is the aggregate thickness of all layers between the shields (i.e., the cumulative thickness of the seed, AFM, pinned, spacer, and free layers, as well as any other layers included between the shields). A larger read gap reduces the sensitivity of the read sensor, thus decreasing the storage density of the disk.

U.S. patent publication US 2014/0027869 by Lee et al. ("Lee") proposes to insert a perpendicular magnetic anisotropy (PMA) enhancement spacer layer between a top free layer and a bottom free layer in an MRAM device to increase the surface anisotropy between the top free layer and the bottom free layer. Both the top free layer and the bottom free layer are made of PMA-CoFeB, and the PMA enhancement spacer layer is made from an amorphous alloy that includes a magnetic material such as Fe or Co, for example, Fe/Ta, Co/Ta, FeB/Ta, Fe/TaN, or FeB/TaN. Lee does not appear to consider a free layer that includes a negative magnetostriction layer (e.g., a layer of Ni or a Ni-rich alloy) to counter the positive magnetostriction of the PMA-CoFeB top and bottom free layers.

In addition to the approaches of Zhang, Sun, and Lee, the MR ratio may be improved by including in the free layer an insertion layer made of a non-magnetic, nano-crystalline or amorphous, material. For example, tantalum (Ta) dusting layers can provide a high MR ratio. The disadvantage of such an approach is that when these types of insertion layers are thick enough that they improve the MR ratio, they can be so thick that they decouple the magnetic layers.

Consequently, there remains a need to develop new free layer constructs that provide high MR ratios by preventing diffusion of unwanted material from the free layer into the spacer layer while minimizing the overall magnetostriction of the free layer to improve MR device stability.

Disclosed herein are embodiments of MR devices with improved free layers that include laminate insertion layers composed of alternating sublayers of magnetic and non-magnetic materials. Also disclosed are methods for fabricating MR devices with such improved free layers. The disclosed laminate insertion layers offer several benefits relative to existing insertion layers, including mitigating the diffusion of atoms from a negative magnetostriction layer 130 of the free layer 50 through a positive magnetostriction layer 110 of the free layer 50 and into the spacer layer 40. Because the improved insertion layers are magnetic, they enable a good exchange-coupled free layer. Moreover, the improved insertion layers are thin and thus do not appreciably increase the read gap when the MR device is incorporated in a read sensor. The improved MR devices can be used in various applications, including, without limitation, hard disk drive read sensors, other read sensors, and MRAM.

FIG. 9 illustrates an improved free layer 50 in accordance with some embodiments. An insertion layer 120 is placed between positive magnetostriction layer 110 and negative magnetostriction layer 130. As shown in FIG. 10, the insertion layer 120 includes at least a first sublayer 200 and a second sublayer 210, where the designations "first" and "second" are merely for convenience and do not necessarily indicate any particular ordering of the sublayers relative to the positive magnetostriction layer 110 and the negative magnetostriction layer 130. In some embodiments, the first sublayer 200 is in contact with the positive magnetostriction layer 110, and the second sublayer 210 is in contact with the negative magnetostriction layer 130. In some embodiments, one of sublayers 200 and 210 is made of a magnetic material, and the other of sublayers 200 and 210 is made of a non-magnetic material. For example, the first sublayer 200 may be iron (Fe), and the second sublayer 210 may be tantalum (Ta). Conversely, the first sublayer 200 may be Ta, and the second sublayer 210 may be Fe.

Figure 12:
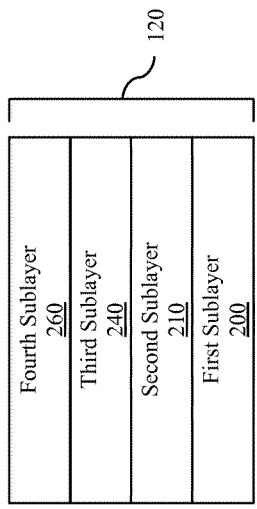
FIG. 12 illustrates a free layer insertion layer with four sublayers in accordance with some embodiments.
Figure 11:
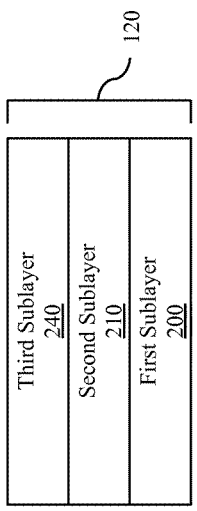
FIG. 11 illustrates a free layer insertion layer with three sublayers in accordance with some embodiments.

In some embodiments, the insertion layer 120 includes more than two sublayers. For example, FIG. 11 illustrates the insertion layer 120 with three sublayers, first sublayer 200, second sublayer 210, and third sublayer 240, and FIG. 12 illustrates the insertion layer 120 with four sublayers, first sublayer 200, second sublayer 210, third sublayer 240, and fourth sublayer 260. In some embodiments in which the insertion layer includes more than two sublayers, every other sublayer is made of a magnetic material, and the intervening sublayers are made of a non-magnetic material. The magnetic material may be, for example, Fe, cobalt (Co), or an iron-cobalt alloy. It is to be appreciated that when the single magnetic material of a magnetic sublayer is an alloy, that sublayer can include its own sublayers of the materials that make up the alloy. For example, a sublayer made of Fe—Co can itself be a laminate of one or more layers of iron and one or more layers of cobalt. The non-magnetic material may be, for example, tantalum (Ta), hafnium (Hf), tungsten (W), vanadium (V), niobium (Nb), zirconium (Zr), titanium (Ti), molybdenum (Mo), chromium (Cr), or some combination of these. In some embodiments, if the first and third sublayers 200 and 240 shown in FIG. 11 include a non-magnetic material (e.g., Ta, Hf, W, V, Nb, Zr, Ti, Mo, or Cr), then the second sublayer 210 includes a magnetic material (e.g., Fe, Co, a Fe—Co alloy). Alternatively, in some embodiments, if the first and third sublayers 200 and 240 of FIG. 11 include a magnetic material (e.g., Fe, Co, a Fe—Co alloy), then the second sublayer 210 includes a non-magnetic material (e.g., Ta, Hf, W, V, Nb, Zr, Ti, Mo, or Cr). Likewise, in some embodiments in which the insertion layer has four sublayers, as shown in FIG. 12, if the first and third sublayers 200 and 240 include a non-magnetic material, then the second and fourth sublayers 210 and 260 include a magnetic material. Alternatively, in some embodiments, if the first and third sublayers 200 and 240 of FIG. 12 include a magnetic material, then the second and fourth sublayers 210 and 260 include a non-magnetic material.

In embodiments in which the insertion layer 120 includes more than one magnetic sublayer, the different magnetic sublayers need not be made of the same magnetic material. For example, one magnetic sublayer could include iron and another cobalt, or one magnetic sublayer could include iron, and another a Fe—Co alloy. Likewise, in embodiments in which the insertion layer 120 includes more than one non-magnetic sublayer, the different non-magnetic sublayers need not be made of the same non-magnetic material. For example, one non-magnetic sublayer could include tantalum and another hafnium.

In embodiments in which the insertion layer includes more than one magnetic sublayer and more than one non-magnetic sublayer, the insertion layer 120 may be considered to include multiple "insertion layer units," where each insertion layer unit has a magnetic sublayer and a non-magnetic sublayer. The insertion layer 120 may be considered to include multiple insertion layer units stacked on each other such that the insertion layer units' orientations are identical. Two insertion layer units are oriented identically if a first insertion layer unit has a non-magnetic sublayer on top of a magnetic sublayer, and a second insertion layer unit also has a non-magnetic sublayer on top of a magnetic sublayer. Likewise, two insertion layer units are oriented identically if a first insertion layer unit has a magnetic sublayer on top of a non-magnetic sublayer, and a second insertion layer unit also has a magnetic sublayer on top of a non-magnetic sublayer. It is to be appreciated that the orientations of different insertion layer units can be the same regardless of whether the different insertion layer units include the same materials or have the same sublayer thicknesses. Moreover, the thicknesses of the different insertion layer units may be different but their orientations the same.

When the different insertion layer units have identical orientations, the result after all of the insertion layer units have been stacked is that the insertion layer 120 has alternating magnetic sublayers and non-magnetic sublayers. This structure can be denoted as [FM/NM]×N, where "FM" represents a magnetic sublayer and "NM" represents a non-magnetic sublayer, and "N" represents the number of insertion layer units in the insertion layer 120. An additional FM sublayer can be included so that the outermost sublayers of the insertion layer 120 are both magnetic sublayers. Alternatively, an additional NM sublayer can be added to the stack so that the outermost sublayers of the insertion layer 120 are both non-magnetic sublayers.

Figure 13:
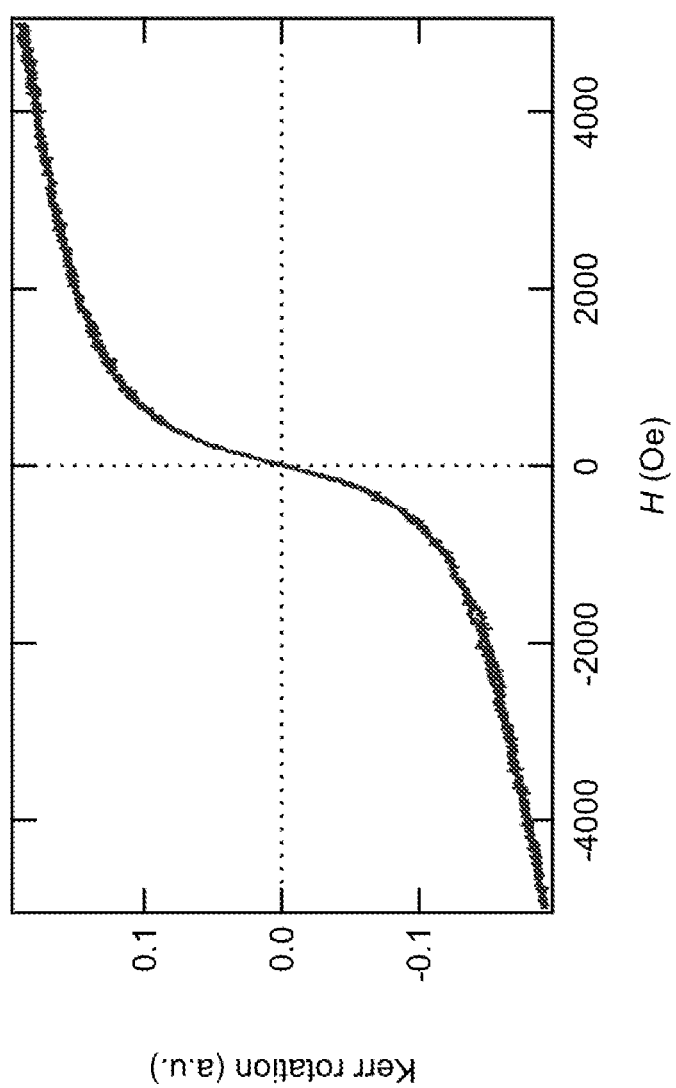
FIG. 13 illustrates the magnetic moment of an exemplary free layer insertion layer having sublayers as shown in FIG. 15.
Figures 14, 15:
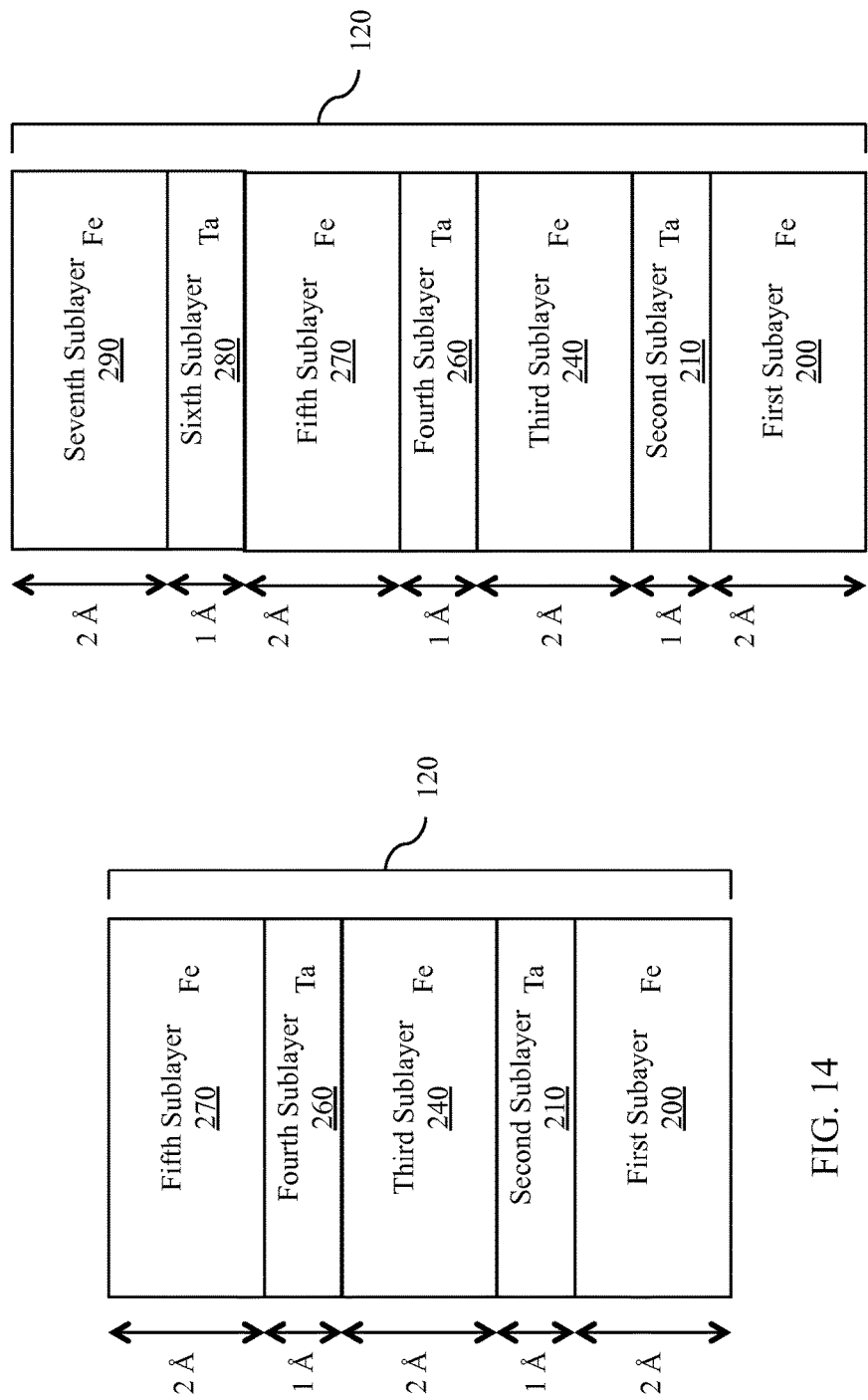
FIG. 14 illustrates a free layer insertion layer that includes five sublayers in accordance with an embodiment.
FIG. 15 illustrates a free layer insertion layer that includes seven sublayers in accordance with an embodiment.

To enable the negative magnetostriction layer 130 to counteract the positive magnetostriction of the positive magnetostriction layer 110 without magnetically decoupling the positive magnetostriction layer 100 from the negative magnetostriction layer 130, thereby causing noise in the MR device, it is preferable for the insertion layer 120 to be magnetic. In addition, as stated earlier, it is preferable to keep the insertion layer 120 as thin as possible while still ensuring a high MR ratio. For example, the inventors have found that an insertion layer thickness less than approximately 12 Angstroms is thin enough to mitigate diffusion into the spacer layer while simultaneously preventing decoupling of the positive magnetostriction layer 110 and the negative magnetostriction layer 130. Furthermore, the inventors have found that when the sublayers of the insertion layer 120 made of the magnetic material are at least twice as thick as the sublayers made of the non-magnetic material, the resulting free layer 50 is sufficiently magnetic and exhibits a desirable Kerr rotation as a function of applied magnetic field. FIG. 13 illustrates the magnetic moment of a sample insertion layer 120 having sublayers as shown in FIG. 15 (discussed below). As shown in FIG. 13, the Kerr rotation has a step-like behavior indicating low coercivity, which is beneficial to magnetic stability of the device, as the magnetic field direction changes from negative to positive.

FIG. 14 illustrates an exemplary embodiment of the insertion layer 120 that includes five sublayers. Each of the first sublayer 200, the third sublayer 240, and the fifth sublayer 270 is made of iron (Fe) and is 2 Angstroms thick. Each of the second sublayer 210 and fourth sublayer 260 is made of tantalum (Ta) and is 1 Angstrom thick. Thus, the insertion layer 120 is a total of 8 Angstroms thick. The embodiment of the insertion layer 120 shown in FIG. 14 has two insertion layer units and one additional magnetic sublayer. There are two ways to define the insertion layer units of FIG. 14. In a first definition, one insertion layer unit includes the first sublayer 200 and the second sublayer 210, and the other insertion layer unit includes the third sublayer 240 and the fourth sublayer 260. This structure can be denoted as [Fe/Ta]×2. In a second definition, one insertion layer unit includes the second sublayer 210 and the third sublayer 240, and the other insertion layer unit includes the fourth sublayer 260 and the fifth sublayer 270. This structure can be denoted as [Ta/Fe]×2. Regardless of which definition is used to define the two insertion layer units, the two insertion layer units are identical in orientation (using the first definition, each insertion layer unit has a layer of tantalum over a layer of iron; using the second definition, each insertion layer unit has a layer of iron over a layer of tantalum), materials (both have magnetic sublayers made of iron and non-magnetic sublayers made of tantalum), sublayer thickness (both have one sublayer that is 2 Angstroms thick and one sublayer that is 1 Angstrom thick), and overall insertion layer unit thickness (both insertion layer units are a total of 3 Angstroms thick). The insertion layer 120 embodiment of FIG. 14 also includes an additional sublayer that is magnetic (made of iron and 2 Angstroms thick), so that the outermost sublayers are magnetic. Depending on which insertion layer unit definition is used, the additional magnetic sublayer is either the fifth sublayer 270 (if the first definition is used) or the first sublayer 200 (if the second definition is used).

FIG. 15 illustrates an exemplary embodiment of the insertion layer 120 that includes seven sublayers. Each of the first sublayer 200, the third sublayer 240, the fifth sublayer 270, and the seventh sublayer 290 is made of iron (Fe) and is 2 Angstroms thick. Each of the second sublayer 210, fourth sublayer 260, and sixth sublayer 280 is made of tantalum (Ta) and is 1 Angstrom thick. Thus, the insertion layer 120 is 11 Angstroms thick. The insertion layer 120 shown in FIG. 15 has three insertion layer units. The structure is similar to the structure of the embodiment shown in FIG. 14, except that there is a third insertion layer unit that is identical to the other two. Thus, the structure of the embodiment shown in FIG. 15 can be denoted as [Fe/Ta]×3 (if the first definition is used) or [Ta/Fe]×3 (if the second definition is used). The three insertion layer units are identical in orientation (using the first definition, each has a layer of tantalum over a layer of iron; using the second definition, each has a layer of iron over a layer of tantalum), materials (each layer has a magnetic sublayer made of iron and a non-magnetic sublayer made of tantalum), sublayer thickness (each has one sublayer that is 2 Angstroms thick and one sublayer that is 1 Angstrom thick), and overall insertion layer unit thickness (each insertion layer units is a total of 3 Angstroms thick). The insertion layer 120 embodiment of FIG. 15 also includes an additional magnetic sublayer (made of iron and 2 Angstroms thick), so that the outermost sublayers are magnetic. Depending on which insertion layer unit definition is used, the additional magnetic sublayer is either the seventh sublayer 290 (if the first definition is used) or the first sublayer 200 (if the second definition is used).

Figure 16:
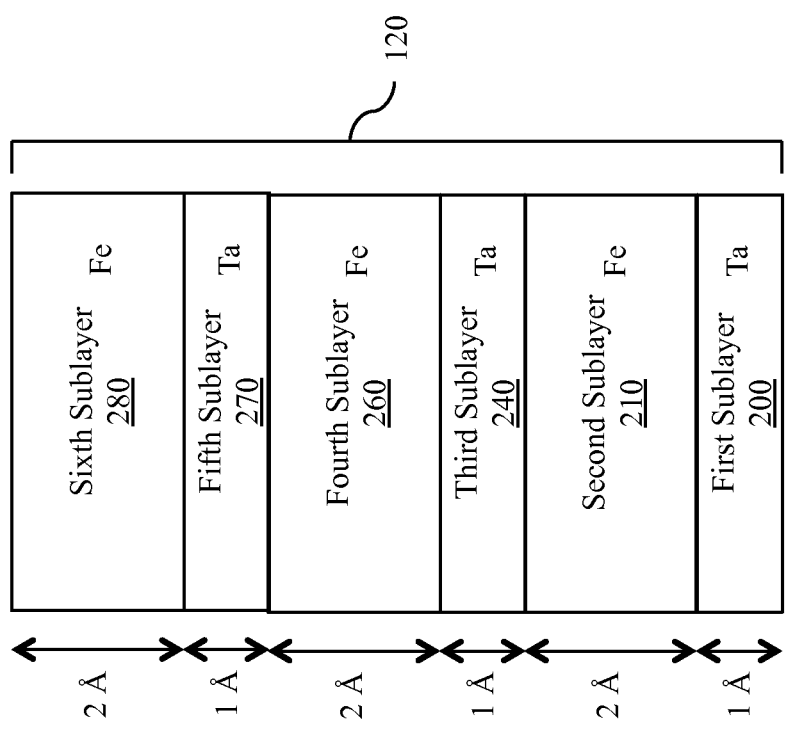
FIG. 16 illustrates a free layer insertion layer that includes six sublayers in accordance with an embodiment.

FIG. 16 illustrates an exemplary embodiment of the insertion layer 120 that includes six sublayers. Each of the first sublayer 200, the third sublayer 240, and the fifth sublayer 270 is made of tantalum (Ta) and is 1 Angstrom thick. Each of the second sublayer 210, fourth sublayer 260, and sixth sublayer 280 is made of iron (Fe) and is 2 Angstroms thick. Thus, the insertion layer 120 is 9 Angstroms thick. The embodiment of the insertion layer 120 shown in FIG. 16 has three insertion layer units. A first insertion layer unit includes the first sublayer 200 and the second sublayer 210, a second insertion layer unit includes the third sublayer 240 and the fourth sublayer 260, and a third insertion layer unit includes the fifth sublayer 270 and the sixth sublayer 280. This structure can be denoted as [Fe/Ta]×3. The three insertion layer units are identical in orientation (each insertion layer unit has a layer of iron over a layer of tantalum), materials (each has magnetic sublayers made of iron and non-magnetic sublayers made of tantalum), sublayer thickness (each has one sublayer that is 2 Angstroms thick and one sublayer that is 1 Angstrom thick), and overall insertion layer unit thickness (each insertion layer units is a total of 3 Angstroms thick).

Referring to the exemplary insertion layers 120 illustrated in FIG. 14, FIG. 15, and FIG. 16, assume for the sake of example that the first sublayer 200 is in contact with (i.e., proximate to) the positive magnetostriction layer 110, and the sublayer furthest from the first sublayer 200 is in contact with the negative magnetostriction layer 130. Under this assumption, in the exemplary embodiment shown in FIG. 16, a non-magnetic sublayer is in contact with the positive magnetostriction layer 110, whereas in the exemplary embodiments shown in FIG. 14 and FIG. 15, a magnetic sublayer is in contact with the positive magnetostriction layer 110. Note also that although, under this assumption, in each of the exemplary embodiments shown in FIG. 14, FIG. 15, and FIG. 16 the negative magnetostriction layer 130 is in contact with a magnetic sublayer of the insertion layer 120, it is not required for the sublayer in contact with the negative magnetostriction layer 130 to be a magnetic sublayer. For example, it is possible to add an additional non-magnetic sublayer on top of the fifth sublayer 270 (FIG. 14), the seventh sublayer 290 (FIG. 15), or the sixth sublayer 280 (FIG. 16).

Figure 17:
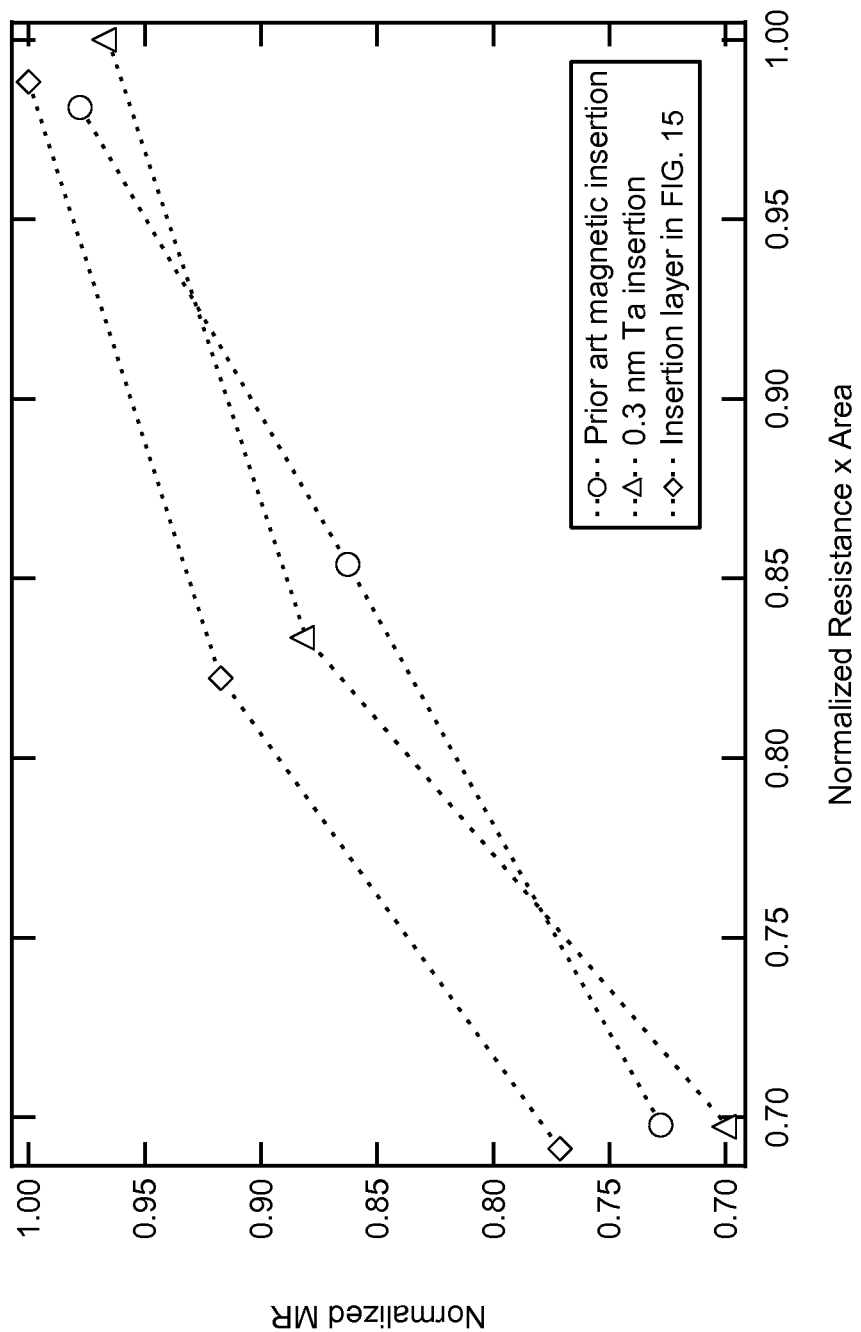
FIG. 17 illustrates the normalized MR ratio versus the normalized resistance times area (RA) for the exemplary free layer illustrated in FIG. 15.

An ideal free layer has a high MR ratio at any selected value of resistance times area. FIG. 17 illustrates the normalized MR ratio versus the normalized resistance times area (RA) of three samples of the free layer 50 with various insertion layers, including the insertion layer 120 illustrated in FIG. 15. For comparison purposes, FIG. 17 also illustrates the normalized MR ratio versus normalized RA of the free layer 50 with an insertion layer made of 3 Angstroms of tantalum (Ta), and another prior art magnetic insertion layer. FIG. 17 shows that the improved laminate insertion layer 120 of FIG. 15 provides a better MR ratio at each RA value. Depending on the selected RA value and the thickness and type of the prior-art insertion layer used for comparison, the improvement ranges from approximately two percent to well over five percent. Furthermore, because the improved insertion layers 120 are magnetic, they will not decouple the positive and negative magnetostriction layers 110 and 130 in the free layer 50. It is to be appreciated that simply using a thicker layer of Ta (e.g., thicker than the 3-Angstrom insertion layer used for comparison in FIG. 17) to attempt to boost the MR ratio would not provide a free layer 50 with the same characteristics as a free layer 50 using the disclosed laminate insertion layers 120 because, as explained above, thicker Ta layers could decouple the magnetic layers.

An ideal free layer also has low coercivity (i.e., magnetic softness), low magnetostriction, low angular dispersion, and a low damping constant. Table A provides the coercivity for sample free layers 50 having alternating layers of iron and tantalum as shown by the embodiments of FIG. 14 and FIG. 15. Also provided in Table A for comparison purposes are the coercivities of sample free layers that have an insertion layer made only of tantalum. The values in Table A indicate that free layers with laminate insertion layers 120 as disclosed herein have low coercivity.

TABLE A

Values of metrics for different free layer insertion layers

| | Metric | | | |
| --- | --- | --- | --- | --- |
| | Value for insertion layer of FIG. 14 | Value for insertion layer of FIG. 15 | Value for insertion layer of 2 Angstroms of tantalum | Value for insertion layer of 3 Angstroms of tantalum |
| Coercivity on easy axis (Oe) | 4.9 | 5.3 | 4.6 | 4.5 |

Figure 18:
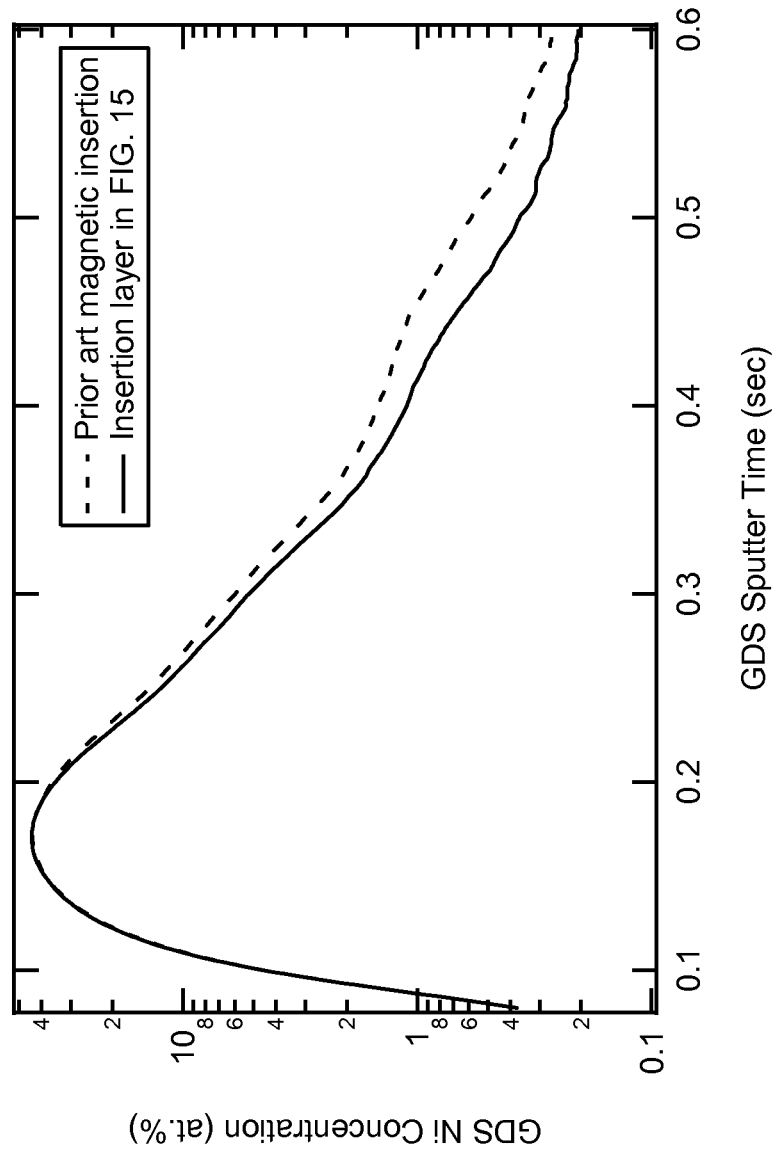
FIG. 18 is a glow discharge spectroscopy (GDS) plot of the concentration of nickel (Ni) in two sample free layers, one having the exemplary laminate insertion layer illustrated in FIG. 15, as a function of GDS sputter time.

FIG. 18 illustrates that the laminate insertion layers 120 disclosed herein mitigate the diffusion of material from the negative magnetostriction layer 130 into the spacer layer 40. FIG. 18 is a glow discharge spectroscopy (GDS) plot, as a function of GDS sputter time, of the concentration of nickel (Ni) in two sample free layers 50, one having a laminate insertion layer 120 in accordance with the embodiment shown in FIG. 15 and the other being a prior-art magnetic insertion layer. The samples for which the plots of FIG. 18 were generated had spacer layers 40 made of MgO and negative magnetostriction layers 130 that contained nickel. The GDS sputter time is a proxy for the distance from the top of the MR device. The peak in the plots of FIG. 18 around 0.175 seconds corresponds roughly to the middle of the negative magnetostriction layer 130. As the sputter time continues to increase, drilling downward into the MR device through the rest of the free layer 50 and into the spacer layer 40, it is clear that the amount of nickel that has diffused to the spacer layer 40 of the sample with the laminate insertion layer 120 of FIG. 15 (solid line) is lower than the amount of nickel that has diffused into the spacer layer 40 in the device using the prior-art insertion layer (dashed line). Thus, FIG. 17 and FIG. 18 indicate that the exemplary laminate insertion layer 120 in accordance with the embodiment of FIG. 15 provides a higher MR ratio for a selected RA value than prior-art insertion layers while also mitigating the diffusion of material from the negative magnetostriction layer 130 into the spacer layer 40.

Figure 19:
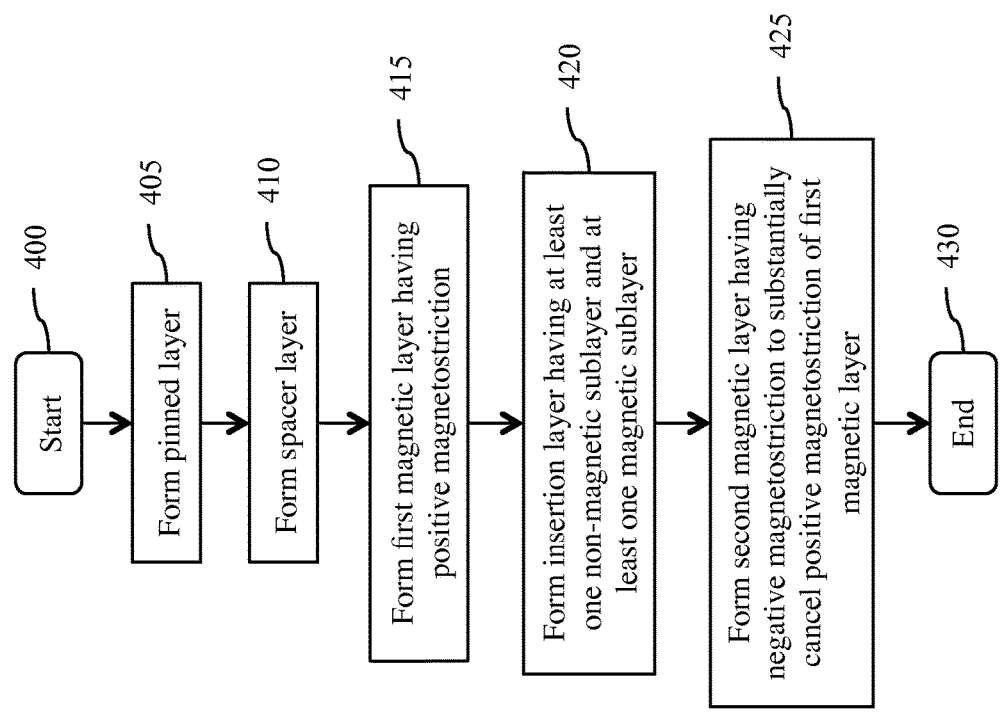
FIG. 19 illustrates a portion of a method or process to manufacture a MR device including a laminate insertion layer in accordance with some embodiments.

FIG. 19 illustrates a portion of a method or process to manufacture a MR device that includes a laminate insertion layer in accordance with some embodiments. At 400, the process begins. At 405, a pinned layer is formed. At 410, a spacer layer is formed. At 415, a first magnetic layer of the free layer is formed. This first magnetic layer has a positive magnetostriction. At 420, a laminate insertion layer is formed. The laminate insertion layer has at least one non-magnetic sublayer and at least one magnetic sublayer. As explained above, either the non-magnetic sublayer or the magnetic sublayer can be in contact with the previously-formed magnetic layer having a positive magnetostriction. At 425, a second magnetic layer of the free layer is formed. This second magnetic layer has a negative magnetostriction that substantially cancels the positive magnetostriction of the first magnetic layer. At 430, the process ends.

It is to be understood that FIG. 19 illustrates only a portion of a process to manufacture a MR device. FIG. 19 does not illustrate, for example, any manufacturing steps to form a seed layer, an AFM layer, a cap layer, or any bias layers that may be included to form the MR device. Forming the layers may be accomplished using sputtering or any other technique that results in layers that have the described characteristics.

In the foregoing description and in the accompanying drawings, specific terminology has been set forth to provide a thorough understanding of the disclosed embodiments. In some instances, the terminology may imply specific details that are not required to practice the invention. For example, the materials used in a MR device may be different from those described above in various embodiments. As a specific example, although some embodiments disclose using MgO in the spacer layer, thereby meaning that the spacer layer is a dielectric and, consequently, the MR device is a TMR device, a TMR device can alternatively have a spacer layer made of aluminum oxide, titanium dioxide, or other materials with similar electrical (e.g., dielectric) properties. Likewise, when the spacer layer is made of a conductor, thereby making the MR device a GMR device, the spacer layer may be made of copper, silver, silver alloys (including Ag—Sn), or other materials with similar electrical (e.g., conduction) properties. In addition, although the disclosure provides CoFe and CoFeB as examples of positive magnetostriction materials that could be used in the free layer, it should be understood that any material providing a high spin polarization could be used in addition or instead. Similarly, although the disclosure discusses the use of nickel or a nickel-rich layer in the negative magnetostriction layer to counteract the positive magnetostriction of the positive magnetostriction layer, it is to be understood that other materials having a negative magnetostriction, such as certain rare earth alloys of Sm and Fe or Co, or certain ferromagnetic multilayers, could be used instead or in addition.

To avoid obscuring the present disclosure unnecessarily, well-known components (e.g., of a disk drive) or layers (e.g., of MR devices) are shown in block diagram form and/or are not discussed in detail or, in some cases, at all. Unless otherwise indicated herein, prior-art seed layers, AFM layers, pinned layers, spacer layers, cap layers, and bias layers may be used with the laminate insertion layer, and prior art MRAM and read sensors, whether used in a hard disk drive or elsewhere, may be adapted to include the disclosed laminate insertion layers.

Furthermore, although the laminate insertion layers have been disclosed for insertion in a free layer having a positive magnetostriction material and a negative magnetostriction material to counterbalance the positive magnetostriction, the insertion layers may be useful in free layers that do not include a positive magnetostriction layer and a negative magnetostriction layer. Moreover, the laminate insertion layers may be used in other layers than the free layer.

Unless otherwise specifically defined herein, all terms are to be given their broadest possible interpretation including meanings implied from the specification and drawings, as well as meanings understood by those skilled in the art and/or as defined in dictionaries, treatises, etc. The terms "magnetization," "direction of magnetization," "magnetization direction," and "magnetic moment" are used interchangeably herein.

As used in the specification and the appended claims, the singular forms "a," "an" and "the" include plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

The term "coupled" is used herein to express a direct connection as well as a connection through one or more intervening circuits or structures. To the extent that the terms "include(s)," "having," "has," "with," and variants thereof are used in the detailed description or the claims, such terms are intended to be inclusive in a manner similar to the term "comprising." The terms "exemplary" and "embodiment" are used to express examples, not preferences or requirements.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

Moreover, although the specific examples of hard disk drives and MRAM are discussed, it is to be understood that the concepts provided herein can be used in other applications in which magnetic sensors or MR devices are useful.

We claim:

1. A magneto-resistive (MR) device, comprising:
   a pinned layer;
   a spacer layer proximate to the pinned layer; and
   a free layer proximate to the spacer layer, wherein the free layer comprises:
   a first magnetic layer proximate to the spacer layer, the first magnetic layer having a positive magnetostriction,
   a magnetic insertion layer proximate to the first magnetic layer, the magnetic insertion layer comprising a first insertion layer unit, the first insertion layer unit comprising a first magnetic sublayer and a first non-magnetic sublayer proximate to the first magnetic sublayer, and
   a second magnetic layer proximate to the magnetic insertion layer, the second magnetic layer having a negative magnetostriction.

2. The MR device of claim 1, wherein the first magnetic sublayer is proximate to the first magnetic layer.

3. The MR device of claim 1, wherein the magnetic insertion layer further comprises a second magnetic sublayer proximate to the first non-magnetic sublayer.

4. The MR device of claim 1, wherein the magnetic insertion layer further comprises one or more additional insertion layer units, wherein each individual insertion layer unit of the one or more additional insertion layer units comprises a magnetic sublayer and a non-magnetic sublayer, and wherein each of the one or more additional insertion layer units is proximate to another insertion layer unit and oriented identically to the first insertion layer unit.

5. The MR device of claim 4, wherein a material of the magnetic sublayer of at least one of the one or more additional insertion layer units is identical to a material of the first magnetic sublayer, and a material of the non-magnetic sublayer of the at least one of the one or more additional insertion layer units is identical to a material of the first non-magnetic sublayer.

6. The MR device of claim 5, wherein a thickness of the at least one of the one or more additional insertion layer units is substantially equal to a thickness of the first insertion layer unit.

7. The MR device of claim 4, further comprising a second magnetic sublayer proximate to a last insertion layer unit, the last insertion layer unit being a one of the one or more additional insertion layer units that is furthest away from the first insertion layer unit.

8. The MR device of claim 7, wherein the first magnetic sublayer is proximate to the first magnetic layer, and the second magnetic sublayer is proximate to the second magnetic layer.

9. The MR device of claim 1, wherein a thickness of the magnetic insertion layer is less than twelve Angstroms.

10. The MR device of claim 1, wherein a thickness of the first magnetic sublayer is less than three times a thickness of the first non-magnetic sublayer.

11. The MR device of claim 1, wherein the first magnetic sublayer comprises iron (Fe), cobalt (Co), or alloys thereof.

12. The MR device of claim 1, wherein the first non-magnetic sublayer comprises tantalum (Ta), hafnium (Hf), tungsten (W), vanadium (V), niobium (Nb), zirconium (Zr), titanium (Ti), molybdenum (Mo), or chromium (Cr).

13. The MR device of claim 1, wherein the spacer layer comprises magnesium oxide (MgO).

14. The MR device of claim 1, wherein the spacer layer comprises copper (Cu), silver (Ag), Ag—Sn alloys, aluminum oxide, or titanium dioxide.

15. The MR device of claim 1, wherein the first magnetic layer comprises cobalt (Co), iron (Fe), boron (B), or any combination of these.

16. The MR device of claim 1, wherein the second magnetic layer comprises nickel (Ni), iron (Fe), or a combination of these.

17. A sensor comprising the MR device of claim 1.

18. A memory comprising the MR device of claim 1.

19. A disk drive comprising the MR device of claim 1.

20. A process for fabricating the MR device of claim 1, the process comprising:
   forming the pinned layer;
   forming the spacer layer proximate to the pinned layer; and
   forming the free layer proximate to the spacer layer, wherein forming the free layer comprises:
      forming the first magnetic layer proximate to the spacer layer, the first magnetic layer having the positive magnetostriction,
      forming the magnetic insertion layer proximate to the first magnetic layer, the magnetic insertion layer comprising the first insertion layer unit, the first insertion layer unit comprising the first magnetic sublayer and the first non-magnetic sublayer proximate to the first magnetic sublayer, and
      forming the second magnetic layer proximate to the magnetic insertion layer, the second magnetic layer having the negative magnetostriction.

21. The process recited in claim 20, wherein forming comprises sputtering.

22. A MR device manufactured according to the process of claim 20.

* * * * *